United States Patent [19]

Ogawa et al.

[11] 4,400,214
[45] Aug. 23, 1983

[54] CONDUCTIVE PASTE

[75] Inventors: Yasuhiro Ogawa, Hirakata; Sankichi Shida, Nara; Katsuhiko Honjo, Takatsuki; Tsunehiko Todoroki, Kusatsu, all of Japan

[73] Assignee: Matsushita Electric Industrial, Co., Ltd., Osaka, Japan

[21] Appl. No.: 376,213

[22] Filed: May 7, 1982

[30] Foreign Application Priority Data

Jun. 5, 1981 [JP] Japan .................................. 56-87312
Jun. 5, 1981 [JP] Japan .................................. 56-87314
Dec. 9, 1981 [JP] Japan .............................. 56-199260

[51] Int. Cl.$^3$ .............................................. C09D 5/24
[52] U.S. Cl. .................................. 106/1.13; 106/1.14; 106/1.17; 106/1.18; 106/1.19; 252/512; 252/514
[58] Field of Search ..................... 106/1.13, 1.14, 1.17, 106/1.18, 1.19; 252/512, 514

[56] References Cited

U.S. PATENT DOCUMENTS 4,255,291  3/1981  Needes et al. ...................... 252/512

Primary Examiner—Lorenzo B. Hayes
Attorney, Agent, or Firm—Wenderoth, Lind & Ponack

[57] ABSTRACT

Disclosed herein is a conductive paste useful for making conductors, including microcircuit conductors, and terminations for capacitors, resistors and piezo-electric transducer elements. The paste comprises an inert liquid vehicle having a metal powder and a glass powder both dispersed therein and is printed and fired in the conventional manner on dielectric substrates. The metal powder comprises an alloy powder, each particle comprising Cu, Al, and at least one of Zn and Ag. The first film of the paste is practically resistant to corrosion and practically conductive and the paste can be produced economically.

12 Claims, No Drawings

CONDUCTIVE PASTE

BACKGROUND OF THE INVENTION

This invention relates to conductive pastes useful for producing conductor patterns adherent to substrates.

Conductive pastes which are applied to and fired on dielectric ceramic substrates (e.g. alumina substrates) usually comprise an inert liquid-vehicle having finely divided inorganic powders (e.g. metal powders and binder powders) and are applied to substrates using so-called "thick film" techniques. Upon firing the printed film of the pastes, the metal powders provides the functional (conductive) utility, while the inorganic binder (e.g. glass powder, $Bi_2O_3$) bonds the metal powders to one another to the substrate. The most commonly used conductive pastes employ noble metals (e.g. Ag, Au, Pd, and their mixtures), especially Ag, as conductive media, since their inert characteristics permit firing at high temperature (e.g. 850° C.) in air and these conductive pastes are used for making conductors.

Since the prices of expensive noble metals, especally Ag, has become higher recently, conductive pastes employing less expensive conductive powder in place of Ag powder has been proposed. For example, conductive pastes employing less expensive powders such as non-noble metal powder (e.g. Ni and Cu) and metallic compound powders (e.g. TiN and $SnO_2$) have been developed and some of them are put on market. These conductive pastes, however, have some disadvantages. The conductive pastes employing non-noble metal powder (e.g. Ni, Cu) have often been confined to specialized uses due to their fired film having bad corrosion-resistant characteristics or have required the great practical inconvenience and expense of firing in non-oxidizing atmosphere, though they show low resistivities just after firing. The fired film of the conductive pastes employing conductive metallic compound powders (e.g. TiN, $SnO_2$) have not shown low resistivities because the powders themselves do not show low resistivity. In addition to this, the conductive paste employing TiN powder have also required the practical inconvenience and expense of firing in non-oxidizing atmosphere.

Meanwhile, conductive pastes employing Ag-coated $Al_2O_3$ powder as conductive media has been proposed. These pastes are economically excellent. But, because of bad wettability of $Al_2O_3$ with Ag, $Al_2O_3$ powder cannot be closely touched with Ag, so Ag-coating layer peels off when Ag-coated $Al_2O$ powders are dispersed in a liquied vehicle. This makes resistivity of fired film larger. Additionally pastes employing powders of oxides such as $Al_2O$ coated with Ag have a disadvantages that fired film cannot be soldered, as well as pastes employing TiN powders or $SnO_2$ powders mentioned above.

Though some kinds of pastes have been proposed for saving Ag, as mentioned, these do not always meat conductivity corrosion-resistance, and solderability. Inexpensive pastes meeting these requirements are expected.

SUMMARY OF THE INVENTION

This invention provides inexpensive conductive pastes which are superior in conductivity, corrosion resistance, and solderability, and are useful for producing conductor patterns on dielectric substrates.

The conductive paste of this invention comprises a liquid vehicle having a metal powder and a glass powder both dispersed therein. The metal powder comprises an alloy powder, each particle comprising Cu, Al, and at least one of Zn and Ag. The alloy powder may have an Ag outer layer, wherein the layer is more than 0.05 micron thick. The metal powder may further comprise an Ag powder, wherein the amount of the Ag powder is 20 to 80 volume percent on the basis of the metal powder. The alloy powder contains Cu majorly, 1-15 weight percent of Al, and 10-40 weight percent of Zn; or preferably contains Cu majorly, 2-8 weight percent of Al, 10-40 weight percent of Zn, and 0.5-5 weight percent of Sn; or preferably contains Cu majorly, 2-8 weight percent of Al, 10-40 weight percent of Zn, and 1-30 weight percent of Ag; or preferably contains Cu maj rly, 2-8 weight percent of Al, 10-40 weight percent of Zn, and 0.01-0.5 weight percent of B; or contains Cu majorly, 2-8 weight percent of Al, and 3-60 weight percent of Ag, respectively on the basis of the alloy powder. The conductive paste comprising the above-mentioned alloy powder shows its best property when it employs a glass powder which is composed majorly of $B_2O_3$, $SiO_2$, and at least one of $Na_2O$, $K_2O$, and $Li_2O$ in the melt, as an inorganic binder. The glass powder is composed of 10-70 molecular percent of $B_2O_3$, 15-60 molecular percent of $SiO_2$, 0-15 molecular percent of $Al_2O_3$, 5-60 molecular percent of at least one of $Na_2O$, $K_2O$, and $Li_2O$, and 0-30 molecular percent of at least one of CaO, MgO, BaO, SrO, and BeO, on the basis of glass compound in the melt. It is better that glass powder does not contain $Bi_2O_3$ and PbO.

DETAILED DESCRIPTION OF THE INVENTION

The essential component of the conductive paste of the present invention is the alloy powder which comprises Cu, Al, and at least one of Zn and Ag.

The presumption is that the requirements for conductive powder of the kind of conductive paste having the glass powder, which paste is fired in air at high temperature, are as follows:

(a) electric conductivity;
(b) inertness against thermal oxidation (thermal oxidation resistibility); and
(c) solderability.

Cu, which is one component of alloy powder contained in the conductive paste of the present invention as conductive medium, is a good conductor, but it is easily corroded or easily oxidized thermally. Especially for conductive media of conductive paste which is fired in air at high temperature, Cu is not suitable, because Cu surface is oxidized so that its conductivity is lost. This weak point of Cu can be improved by adding Al to Cu to make Cu-Al alloy. Little oxide is formed on Cu-Al alloy surface when Cu-Al alloy powder is heated in oxidizing atmosphere. This might be because thin $Al_2O_3$ layer formed on the surface, prevents the alloy powder from being oxidized further. In this case, however, the conductivity of the fired film of the paste employing Cu-Al powder becomes worse, because the conductive path of the fired film depends on the contact of powders, and also the solderability becomes worse. This weak point of Cu-Al alloy powder can be improved greatly by adding one of Zn and Ag to Cu-Al to make Cu-Al-Zn alloy or Cu-Al-Ag alloy. The fired films of the paste employing Cu-Al-Zn alloy powder or Cu-Al-Ag alloy powder have comparatively good conductivity and solderability. It is not clear why alloying Cu-Al alloy with one of Zn and Ag leads to these improvements, but it might be assumed as follows: in the case of Cu-Al-Zn alloy, Zn might prevent $Al_2O_3$ layer from growing the above said necessity by the phenomenon that Zn sublimates from the alloy surface during firing. Meanwhile, in the case of Cu-Al-Ag alloy, it can be thought that Ag, by its own inertness against thermo-oxidation and solderbility, makes Cu-Al-Ag alloy have good properties. Taking it into consideration that Cu-Ag alloy creates much oxide on the surface because of having lower resistance against thermo-oxidation, the improvement mentioned above might be responsible for multiplication effect of alloying 3 elements of Cu, Al, and Ag. The weak point of alloying Cu-Al alloy with Ag is the economical depreciation, which is against the purpose of the present invention, so the amount of Ag in the Cu-Al-Ag alloy should be limited to the minimum necessity.

Cu-Al-Zn alloy powders and Cu-Al-Ag alloy powder make the conductive path by the action mentioned above, wherein the contact of the powders keep the conductivity of the conductive path, so if the paste would be fired under the condition that the alloy powders would melt into each other, the $Al_2O_3$ layer would be broken and the alloy powder would keep being oxidized to be nonconductive.

In the case of Cu-Al-Zn alloy powder, alloying the alloy with one of B, Ag and Sn to make Cu-Al-Zn-B alloy powder, Cu-Al-Zn-Ag alloy powder, and Cu-Al-Zn-Sn alloy powder can make the properties of the conductive powders of the conductive pastes better. In the case of the Cu-Al-Zn-B alloy powder, $B_2O_3$ layer might be made on the surface to protect the alloy powder from oxidizing and a part of the $B_2O_3$ might melt into the glass. Alloying the Cu-Al-Zn alloy with Ag might make the contact of the alloy powder in good condition. Alloying the Cu-Al-Zn alloy with Sn makes the fired-film more solderable, but the more Sn might make the resistance against thermo-oxidation lower.

By the reason mentioned above, the alloy compositions, in which each alloy powder can have a good effect, are as follows: in the case of Cu-Al-Zn alloy powder, 1-15 weight percent of Al, 10-40 weight percent of Zn, and the remainder Cu; in the case of Cu-Al-Zn-B alloy powder 2-8 weight percent of Al, 10-40 weight percent of Zn, 0.01-0.5 weight percent of B, the remainder Cu; in the case of Cu-Al-Zn-Ag alloy powder 2-8 weight percent of Al, 10-40 weight percent of Zn, 1-15 weight percent of Ag, the remainder Cu; in the case of Cu-Al-Zn-Sn alloy powder 2-8 weight percent of Al, 10-40 weight percent of Zn, 0.5-5 weight percent of Sn, the remainder Cu; and in the case of Cu-Al-Ag alloy powder 2-8 weight percent of Al, 3-60 weight percent of Ag, the remainder Cu, respectively. The minimum amounts of the alloying elements are determined so that the element can produce the good effect mentioned above and the maximum amounts thereof are restricted by the economical aspect in the case of Ag; and are restricted by conductivity, solderability, resistance against thermo-oxidation, and segregation when the alloy is produced in the case of another element. If the economical condition is not taken into consideration, alloying the above alloy powders with Pt, Pd, Au etc. may produce a good effect on the fired film.

As described above, alloy powders comprising Cu, Al, and at least one of Zn and Ag, for example, Cu-Al-Zn alloy powder, Cu-Al-Zn-B alloy powder, Cu-Al-Zn-Ag alloy powder, Cu-Al-Zn-Sn alloy powder, and Cu-Al-Ag alloy powder, have good properties as conductive media of conductive pastes.

According to the present invention, the alloy powders having outer Ag layer coated or the mixture of the alloy powders and Ag powders may be also employed as conductive media of conductive pastes to make the properties of the fired film better. The outer Ag layer can make the contact of the alloy powder in good condition and increase the conductivity and the solderability of the fired film. The thickness of the outer Ag layer is decided by taking the diameter of the alloy powders and the conductivity and economical aspect into consideration. If the diameter of the alloy powder is 0.5-5μ, the outer Ag layer of at least 0.05μ thick can produce good effects. Employing the Ag powders and alloy powders together as conductive media can also increase the conductivity and the solderability of the fired film. The amount of at least 20 volume percent Ag powder on the basis of the mixture of the Ag powder and the alloy powder can produce good effects. The amount of more than 80 volume percent of Ag powder on the basis of the mixture cannot achieve the objects of the present invention from the economical aspect.

The properties of the fired film of the conductive paste comprising the above said alloy powder are influenced by the glass composition of the glass powder which bonds the conductive media to one another and to the substrate by melting and resoldifying during firing. Vitreous melt tends to corrode a metal, especially the alloy comprising Cu, Al, and one of Zn and Ag. When the conductive pastes employ the alloy powder together with the glass powder whose corroding nature is strong, the alloy powders are corroded by the vitreous melt to make the fired film of the pastes nonconductive and nonsolderable. We have found that the glass powder composed majorly of $B_2O_3$, $SiO_2$, and one or more of $Na_2O$, $K_2O$, and $Li_2O$ is fit for the conductive pastes employing the alloy powders. The corroding nature of the glass powders was estimated from the appearance of the film, fired at 850° C. in air on the alumina substrate, of the conductive pastes employing the alloy powders together therewith, wherein the alloy powder was composed of 8 weight percent of Al, 25 weight percent of Zn, and the remainders Cu on the alloy basis. These results are set forth on Table 1.

On Table 1, the glass powders which corroded the fired film into black are shown by the mark x. The glass powders which slightly corroded the fired film partly into black are shown by the mark Δ. The glass powders which hardly corroded the fired film are shown by the mark o. $B_2O_3$ is not corrosive, but the increase of the amount of $B_2O_3$ makes the glass powder tend to dissolve into water. $SiO_2$ is not corrosive, but the increase of the amount of $SiO_2$ makes the softening point of the glass powder higher and the use of the glass powder tend to be limited. $Na_2O$, $Li_2O$, and/or $K_2O$ make the softening point of the glass powder lower and the use of the glass powder tend not to be limited, but these oxides make the glass powder tend to be corrosive. $Al_2O_3$ makes the glass powder less corrosive, but $Al_2O_3$ makes the softening point of the glass powder higher. CaO, MgO, SrO, BaO, and/or BeO make the glass powder much less corrosive and make the glass powder tend to be non-soluble in water, but these make the softening point of the glass powder higher.

Complementing the advantages and the disadvantages of the ingredients of the glass powder mentioned above, the chemical compositions of the glass powders which are good in usage and corrosion are: 10-70 molecular percent of $B_2O_3$, 15-60 molecular percent of $SiO_2$, 0-15 molecular percent of $Al_2O_3$, 5-50 molecular percent of $Na_2O$, $Li_2O$, and/or $K_2O$, and 0-30 molecular percent of CaO, MgO, BaO, SrO, and/or BeO. The fired film of the Ag paste employing the glass powder put on the market ($PbO \cdot B_2O_3 \cdot SiO_2$) and that of the Ag pastes employing the glass powder according to the present invention were put into the humidity test, but there were no differences in the resistivity change, so the glass powders according to the present invention are as waterproof as those put on the market.

$Na_2CO_3$ instead of $Na_2O$, $K_2CO_3$ instead of $K_2O$, $Li_2CO_3$ instead of $Li_2O$, and $H_2BO_3$ instead of $B_2O_3$, for example, can be used as the ingredients of the glass powder, because these chemical compounds finally change into the oxides during making glass powders.

According to the present invention, the conductive pastes are made by dispersing the metal powders comprising the alloy powders together with the glass powders in liquid vehicle. Like the conventional Ag pastes, these pastes, printed on the ceramic substrates and dried and be fired in the air, can be used as the termination and the conductive circuit and the like. The diameters of the metal powder and the glass powders should be ranging 0.05–10μ, preferably 0.5–5μ. The powders of the diameters of over 10μ make the printing character of the pastes worse so that the conductivity of the fired film of the pastes become worse.

EXAMPLE i. Preparation of alloy powders

The alloy powders according to the present invention were made in the following way. Each element of Cu, Al, Zn, Ag, B, and/or Sn was weighed in accordance with the alloy compositions of the present invention into the total amount of 1 kg. Cu-Al mother alloy, Cu-Zn mother alloy, and Cu-Ag mother alloy were conveniently used as alloy elements. These elements were melted in $N_2$ atmosphere and were atomized into powders by atomization, wherein the $N_2$ gas was used as spraying gas and the sprayed powders were cooled in the water. The resultant alloy powders, whose diameter ranged 5–100μ, were additionally crushed by the mechanical crusher into the powders of the average diameter of about 2μ. These alloy powders were listed on Table 2.

Some alloy powders were dipped into the electroless Ag plating solution (the mixture of the silver ammonium nitrate solution and the Rochelle salt (Sodium Potassium tartrate) solution) at 20° C. for 90 minutes to have the surface of the alloy powders coated with the Ag layer of about 0.1μ thickness. Ag coated alloy powders were washed with water and dried at 120° C. for 1 hour. These Ag-coated alloy powders were shown by the number on Table 2 plus asterisk on the tables described below.

These alloy powders were supplied as the conductive media for the conductive pastes.

ii. Preparation of glass powders

Each ingredient of $B_2O_3$, $SiO_2$, $Al_2O_3$, $Na_2O$ (and/or $K_2O$, $Li_2O$), CaO (and/or MgO, BaO, SrO, BeO) was weighed in accordance with the chemical composition of the glass powders of the present invention into the total amount of 20 grams. $Na_2CO_3$, $Li_2CO_3$, and $K_2CO_3$ were conveniently used as ingredients. These were, after mixed, melted together in Pt crucible in the furnace at 1300° C. for 2 hours. The melt was fritted by pouring into cold water, and the resultant frit was ground to the average diameter of about 2μ.

iii. Preparation of test specimens

The alloy powders and the Ag-coated alloy powders and the glass powders prepared as described above and Ag powders on the market (average diameter was about 2μ) were weighed in accordance with the prescribed mixing ratio into the total amount of 3 g, wherein the amount of the glass powder was 10-20 weight percent of the total amount. These powders were dispersed together in a vehicle of terpineol and ethyl cellulose by the use of the automatic muller (Toyoseike Seisakusho). The resultant pastes were printed through a patterned 200-mesh screen on alumina substrates. The prints were dried at 120° C. for 10 minutes, and then fired with a 60 minutes cycle to a peak temperature of 750°–850° C. for 10 minutes in air in a tunnel furnace. Fired film thickness ranged 15–20μ.

Resistivity (in $\Omega/\square$) was measured by a Digital multimeter (Takeda Riken Co. Model No. TR-6856) on fired films.

Solderability was determined from the soldered area the fired films after dipped in 62Sn/36Pb/2Ag solder at 220°–230° C. for 3 seconds. On the tables described below, the fired films whose soldered area was near 100 percent were shown by the mark o, the fired films whose soldered area was about half were shown by the mark Δ, and the fired film which could be hardly soldered were shown by the mark x.

iv. Examples 1–45, 60 and Showing A, B, C, D, E, F, G

Conductive pastes employing various alloy powders on Table 2 dispersed together with various glass powders on Table 1 in liquid vehicle were printed on alumina substrates, dried and fired in air. Table 3 sets forth resistivity and solderability of the fired samples. Showing A is the conventional Ag paste. Showing B is a paste employing Cu powder. Showings C, D, E, F, G are pastes employing the alloy powders according to the present invention and glass powder not according to the present invention.

v. Examples 46–59 and Showing H

Conductive pastes employing various Ag-coated alloy powders dispers together with various glass powders on Table 1 in liquid vehicle, wherein outer Ag layers were about 0.1 thick, were printed on alumina substrates, dried and fired in air. Table 4 sets forth the resistivity and the solderability of the fired samples.

Showing H is a paste employing Ag-coated Cu powder.

vi. Examples 61–133 and Showings I, J, K, L, M

Conductive pastes employing mixtures of various alloy powders on Table 2 together with various glass powders on Table 1 in liquid vehicle were printed an alumina substrates, dried and fired in air. Table 5 sets forth the resistivity and the solderability of the fired samples.

Showing I is a paste employing the mixture of Cu powder and Ag powder. Showing J, K, L, and M are paste employing the mixtures of the alloy powders according to the present invention and the glass powder not according to the present invention.

TABLE 1

| Glass powder No. | Glass melt ingredient (molecular %) | | | | | | | | | | | Appearance of the fired film |
|---|---|---|---|---|---|---|---|---|---|---|---|---|
| | $B_2O_3$ | $SiO_2$ | $Al_2O_3$ | $Na_2O$ | $Li_2O$ | $K_2O$ | CaO | MgO | SrO | BaO | BeO | |
| 1 | 10 | 60 | | 30 | | | | | | | | Δ |
| 2 | 70 | 25 | | 5 | | | | | | | | Δ - o |
| 3 | 70 | 25 | | | 5 | | | | | | | Δ - o |
| 4 | 70 | 25 | | | | 5 | | | | | | Δ - o |
| 5 | 10 | 40 | | 50 | | | | | | | | Δ |
| 6 | 10 | 40 | | | 50 | | | | | | | Δ |
| 7 | 10 | 40 | | | | 50 | | | | | | Δ |
| 8 | 10 | 40 | 10 | 30 | | | 10 | | | | | Δ - o |
| 9 | 30 | 30 | 5 | 5 | | | 30 | | | | | o |
| 10 | 30 | 30 | 5 | | 5 | | 30 | | | | | o |
| 11 | 30 | 30 | 5 | | | 5 | 30 | | | | | o |
| 12 | 30 | 30 | 5 | 5 | | | | 30 | | | | o |
| 13 | 30 | 30 | 5 | 2 | 3 | | | | 30 | | | o |
| 14 | 30 | 30 | 5 | | 2 | 3 | | | | 30 | | o |
| 15 | 30 | 30 | 5 | 3 | | 2 | | | | | 30 | o |
| 16 | 30 | 30 | 5 | 5 | | | 10 | 10 | 10 | | | o |
| 17 | 30 | 30 | 5 | | 5 | | | 10 | 10 | 10 | | o |
| 18 | 20 | 50 | 5 | 5 | 5 | | 10 | 5 | | | | o |
| 19 | 15 | 50 | 10 | 15 | | | | | 10 | | | o |
| 20 | 65 | 15 | 10 | 5 | | 5 | | | | | | Δ - o |
| 21 | 60 | 15 | 15 | | 5 | 10 | | | | | | Δ - o |
| 22 | put on the market ($ZnO.B_2O_3.SiO_2$) | | | | | | | | | | | x - Δ |
| 23 | put on the market ($PbO.B_2O_3.SiO_2$) | | | | | | | | | | | x |
| 24 | put on the market ($Bi_2O_3.B_2O_3.SiO_2$) | | | | | | | | | | | x |

TABLE 2

| Alloy powder No. | Alloy composition (wt %) | | | | | |
|---|---|---|---|---|---|---|
| | Al | Zn | Ag | B | Sn | Cu |
| 1 | 1 | 10 | — | — | — | rest |
| 2 | 3 | 20 | — | — | — | rest |
| 3 | 6 | 15 | — | — | — | rest |
| 22 | 8 | 25 | — | — | — | rest |
| 4 | 15 | 20 | — | — | — | rest |
| 5 | 5 | 40 | — | — | — | rest |
| 6 | 2 | 40 | — | 0.06 | — | rest |
| 7 | 4 | 30 | — | 0.1 | — | rest |
| 8 | 5 | 30 | — | 0.01 | — | rest |
| 9 | 8 | 25 | — | 0.5 | — | rest |
| 10 | 2 | 40 | 1 | — | — | rest |
| 11 | 8 | 15 | 15 | — | — | rest |
| 12 | 4 | 10 | 30 | — | — | rest |
| 13 | 5 | 30 | 15 | — | — | rest |
| 14 | 2 | 40 | — | — | 0.5 | rest |
| 15 | 4 | 30 | — | — | 3 | rest |
| 16 | 5 | 30 | — | — | 2 | rest |
| 17 | 8 | 25 | — | — | 5 | rest |
| 18 | 2 | — | 20 | — | — | rest |
| 19 | 4 | — | 60 | — | — | rest |
| 20 | 5 | — | 10 | — | — | rest |
| 21 | 8 | — | 3 | — | — | rest |

TABLE 3

| Example No. | Alloy powder No. | Glass powder No. | Resistivity (Ω/□) | Solderability |
|---|---|---|---|---|
| 1 | 1 | 9 | 0.5–10 | Δ |
| 2 | 2 | 18 | 0.1–0.5 | o |
| 3 | 3 | 1 | 0.1–0.4 | Δ |
| 4 | 3 | 2 | 0.05–0.3 | Δ - o |
| 5 | 3 | 5 | 0.1–0.5 | Δ |
| 6 | 3 | 8 | 0.07–0.3 | Δ - o |
| 7 | 3 | 10 | 0.05–0.2 | o |
| 8 | 3 | 13 | 0.05–0.2 | o |
| 9 | 3 | 16 | 0.05–0.2 | o |
| 10 | 3 | 18 | 0.05–0.2 | o |
| 11 | 3 | 19 | 0.07–0.3 | Δ - o |
| 12 | 3 | 20 | 0.07–0.3 | Δ - o |
| 13 | 3 | 21 | 0.05–0.3 | Δ - o |
| 60 | 22 | 13 | 1–7 | Δ |
| 14 | 4 | 11 | 2–10 | Δ |
| 15 | 5 | 12 | 0.7–5 | Δ |
| 16 | 6 | 10 | 0.5–2 | o |
| 17 | 7 | 3 | 0.5–1.5 | o |
| 18 | 7 | 6 | 0.7–2 | Δ - o |
| 19 | 7 | 9 | 0.3–0.7 | o |
| 20 | 7 | 12 | 0.3–0.7 | o |
| 21 | 7 | 17 | 0.3–0.7 | o |
| 22 | 7 | 20 | 0.5–1.2 | o |
| 23 | 8 | 13 | 1–5 | Δ |
| 24 | 9 | 16 | 0.7–3 | Δ |
| 25 | 10 | 14 | 0.5–1 | Δ |
| 26 | 11 | 15 | 1–3 | Δ |
| 27 | 12 | 1 | 0.1–0.5 | o |
| 28 | 12 | 7 | 0.2–1.5 | Δ - o |
| 29 | 12 | 14 | 0.05–0.3 | o |
| 30 | 13 | 16 | 0.1–0.7 | Δ - o |
| 31 | 14 | 9 | 0.5–1.5 | Δ |
| 32 | 15 | 5 | 0.4–1.3 | Δ - o |
| 33 | 15 | 10 | 0.3–1 | o |
| 34 | 15 | 21 | 0.3–1 | o |
| 35 | 16 | 11 | 1–7 | Δ |
| 36 | 17 | 12 | 0.3–1.5 | Δ |
| 37 | 18 | 13 | 0.1–1 | Δ |
| 38 | 19 | 1 | 0.1–0.3 | Δ |
| 39 | 19 | 4 | 0.02–0.2 | o |
| 40 | 19 | 5 | 0.1–0.5 | Δ |
| 41 | 19 | 8 | 0.02–0.1 | o |
| 42 | 19 | 14 | 0.01–0.05 | o |
| 43 | 19 | 19 | 0.03–0.1 | o |
| 44 | 20 | 16 | 0.2–3 | Δ |
| 45 | 21 | 21 | 0.8–4.5 | Δ |
| Showing A | Ag | 24 | 0.005–0.05 | o |
| Showing B | Cu | 9 | ∞ | x |
| Showing C | 3 | 22 | ∞ | x |
| Showing D | 7 | 22 | ∞ | x |
| Showing E | 12 | 22 | ∞ | x |
| Showing F | 15 | 22 | ∞ | x |
| Showing G | 19 | 22 | ∞ | x |

TABLE 4

| Example No. | Ag-coated alloy powder No. | outer Ag layer (μ) | Glass powder No. | Resistivity (Ω/□) | Solderability |
|---|---|---|---|---|---|
| 46 | 1* | 0.1 | 9 | 0.2–1 | o |
| 47 | 3* | 0.1 | 10 | 0.02–0.1 | o |
| 48 | 4* | 0.1 | 11 | 0.05–0.5 | o |

TABLE 4-continued

| Example No. | Ag-coated alloy powder No. | outer Ag layer (μ) | Glass powder No. | Resistivity (Ω/□) | Solder- ability |
|---|---|---|---|---|---|
| 49 | 5* | 0.1 | 12 | 0.05-2 | Δ |
| 50 | 6* | 0.1 | 10 | 0.02-0.1 | o |
| 51 | 7* | 0.1 | 12 | 0.01-0.1 | o |
| 52 | 8* | 0.1 | 13 | 0.05-1 | Δ - o |
| 53 | 9* | 0.1 | 16 | 0.05-0.7 | o |
| 54 | 10* | 0.1 | 14 | 0.05-0.7 | o |
| 55 | 13* | 0.1 | 16 | 0.05-0.5 | o |
| 56 | 14* | 0.1 | 9 | 0.05-0.8 | o |
| 57 | 16* | 0.1 | 11 | 0.1-0.8 | o |
| 58 | 18* | 0.1 | 13 | 0.03-0.5 | o |
| 59 | 20* | 0.1 | 16 | 0.02-0.8 | o |
| Showing H | Cu | 0.1 | 9 | >100k | x |

TABLE 5

| Example No. | Alloy powder No. | Volume mixing ratio Alloy powder to Ag powder | Glass powder No. | Resistivity (Ω/□) | Solder- ability |
|---|---|---|---|---|---|
| 61 | 1 | 80:20 | 9 | 0.1-1 | o |
| 62 | 1 | 50:50 | 9 | 0.05-0.2 | o |
| 63 | 1 | 20:80 | 9 | 0.01-0.07 | o |
| 64 | 2 | 80:20 | 18 | 0.05-0.2 | o |
| 65 | 2 | 50:50 | 18 | 0.01-0.07 | o |
| 66 | 2 | 20:80 | 18 | 0.007-0.05 | o |
| 67 | 3 | 80:20 | 10 | 0.03-0.1 | o |
| 68 | 3 | 50:50 | 10 | 0.01-0.07 | o |
| 69 | 3 | 20:80 | 10 | 0.005-0.05 | o |
| 70 | 22 | 80:20 | 13 | 0.2-1 | Δ |
| 71 | 22 | 50:50 | 1 | 0.2-0.5 | Δ |
| 72 | 22 | 50:50 | 2 | 0.15-0.5 | Δ - o |
| 73 | 22 | 50:50 | 5 | 0.3-0.7 | Δ |
| 74 | 22 | 50:50 | 9 | 0.2-0.5 | o |
| 75 | 22 | 50:50 | 10 | 0.1-0.3 | o |
| 76 | 22 | 50:50 | 13 | 0.1-0.3 | o |
| 77 | 22 | 50:50 | 17 | 0.05-0.2 | o |
| 78 | 22 | 50:50 | 20 | 0.1-0.3 | o |
| 79 | 22 | 20:80 | 13 | 0.02-0.1 | o |
| 80 | 4 | 80:20 | 11 | 0.7-3 | o |
| 81 | 4 | 50:50 | 11 | 0.07-0.7 | o |
| 82 | 4 | 20:80 | 11 | 0.05-0.2 | o |
| 83 | 5 | 80:20 | 12 | 0.3-1 | o |
| 84 | 5 | 50:50 | 12 | 0.03-0.5 | o |
| 85 | 5 | 20:80 | 12 | 0.01-0.07 | o |
| 86 | 6 | 80:20 | 10 | 0.2-1 | o |
| 87 | 6 | 50:50 | 10 | 0.07-0.5 | o |
| 88 | 6 | 20:80 | 10 | 0.05-0.3 | o |
| 89 | 7 | 80:20 | 17 | 0.1-0.5 | o |
| 90 | 7 | 50:50 | 1 | 0.2-0.5 | Δ |
| 91 | 7 | 50:50 | 3 | 0.15-0.5 | o |
| 92 | 7 | 50:50 | 6 | 0.3-0.7 | Δ - o |
| 93 | 7 | 50:50 | 8 | 0.3-0.7 | o |
| 94 | 7 | 50:50 | 11 | 0.1-0.3 | o |
| 95 | 7 | 50:50 | 14 | 0.1-0.3 | o |
| 96 | 7 | 50:50 | 17 | 0.05-0.2 | o |
| 97 | 7 | 50:50 | 21 | 0.07-0.2 | o |
| 98 | 8 | 80:20 | 13 | 0.2-2 | o |
| 99 | 8 | 50:50 | 13 | 0.07-0.3 | o |
| 100 | 8 | 20:80 | 13 | 0.05-0.2 | o |
| 101 | 9 | 80:20 | 16 | 0.2-1 | o |
| 102 | 9 | 50:50 | 16 | 0.07-0.3 | o |
| 103 | 9 | 20:80 | 16 | 0.05-0.2 | o |
| 104 | 10 | 80:20 | 14 | 0.05-0.3 | o |
| 105 | 10 | 20:80 | 14 | 0.02-0.1 | o |
| 106 | 11 | 80:20 | 15 | 0.5-2 | o |
| 107 | 11 | 50:50 | 15 | 0.2-0.7 | o |
| 108 | 11 | 20:80 | 15 | 0.05-0.2 | o |
| 109 | 12 | 80:20 | 16 | 0.02-0.3 | o |
| 110 | 12 | 50:50 | 16 | 0.01-0.1 | o |
| 111 | 14 | 80:20 | 9 | 0.1-0.7 | o |
| 112 | 14 | 50:50 | 9 | 0.05-0.2 | o |
| 113 | 14 | 20:80 | 9 | 0.03-0.1 | o |
| 114 | 15 | 80:20 | 10 | 0.07-0.3 | o |
| 115 | 15 | 50:50 | 10 | 0.05-0.1 | o |
| 116 | 15 | 20:80 | 10 | 0.03-0.1 | o |
| 117 | 16 | 80:20 | 11 | 0.3-2 | o |
| 118 | 16 | 50:50 | 11 | 0.1-0.5 | o |
| 119 | 16 | 20:80 | 11 | 0.05-0.2 | o |
| 120 | 17 | 80:20 | 12 | 0.1-0.5 | o |
| 121 | 17 | 50:50 | 12 | 0.05-0.2 | o |
| 122 | 17 | 20:80 | 12 | 0.02-0.1 | o |
| 123 | 18 | 80:20 | 13 | 0.05-0.5 | o |
| 124 | 18 | 50:50 | 13 | 0.02-0.2 | o |
| 125 | 18 | 20:80 | 13 | 0.01-0.1 | o |
| 126 | 19 | 80:20 | 14 | 0.007-0.05 | o |
| 127 | 19 | 50:50 | 14 | 0.005-0.05 | o |
| 128 | 20 | 80:20 | 16 | 0.1-0.7 | o |
| 129 | 20 | 50:50 | 16 | 0.05-0.2 | o |
| 130 | 20 | 20:80 | 16 | 0.03-0.1 | o |
| 131 | 21 | 80:20 | 21 | 0.2-1 | o |
| 132 | 21 | 50:50 | 21 | 0.1-0.5 | o |
| 133 | 21 | 20:80 | 21 | 0.05-0.2 | o |
| Showing I | Cu | 50:50 | 17 | ∞ | x |
| Showing J | 22 | 50:50 | 22 | 3-10 | x |
| Showing K | 22 | 50:50 | 23 | 5-20 | x |
| Showing L | 7 | 50:50 | 22 | 5-20 | x |
| Showing M | 7 | 50:50 | 23 | 10-20 | x |

What is claimed is:

1. A conductive paste comprising a liquid vehicle having a metal powder and a glass powder both dispersed therein, wherein said metal powder comprises an alloy powder, each particle thereof comprising copper, aluminum, and at least one of zinc and silver.

2. A conductive paste according to claim 1, wherein said each particle of said alloy powder has a silver outer layer.

3. A conductive paste according to claim 2, wherein said silver outer layer is more than 0.05 micron thick.

4. A conductive paste according to claim 1, wherein said metal powder further comprises a silver powder.

5. A conductive paste according to claim 4, wherein the amount of said silver powder is 20 to 80 volume percent on the basis of said metal powder.

6. A conductive paste according to claim 1, 2, 3, 4 or 5, wherein said alloy powder comprises 1-15 weight percent of aluminum, 10-40 weight percent of zinc and the balance essentially copper on the basis of said alloy powder.

7. A conductive paste according to claim 1, 2, 3, 4 or 5, wherein said alloy powder comprises 2-8 weight percent of aluminum, 10-40 weight percent of zinc, 0.5-5 weight percent of tin and the balance essentially copper on the basis of said alloy powder.

8. A conductive paste according to claim 1, 2, 3, 4 or 5 wherein said alloy powder comprises 2-8 weight percent of aluminum, 10-40 weight percent of zinc, 1-30 weight percent of silver and the balance essentially copper on the basis of said alloy powder.

9. A conductive paste according to claim 1, 2, 3, 4 or 5, wherein said alloy powder comprises 2-8 weight percent of aluminum, 10-40 weight percent of zinc, 0.01 to 0.5 weight percent of boron and the balance essentially copper on the basis of said alloy powder.

10. A conductive paste according to claim 1, 2, 3, 4 or 5, wherein said alloy powder comprises 2 to 8 weight percent of aluminum, 3 to 60 weight percent of silver and the balance essentially copper on the basis of said alloy powder.

11. A conductive paste according to claim 1, 2, 3, 4 or 5, wherein said glass powder comprises $B_2O$, $SiO_2$, and one or more of $Na_2O$, $K_2O$, and $Li_2O$.

12. A conductive paste according to claim 1, 2, 3, 4 or 5, wherein said glass powder has the following composition:

| ingredients: | molecular percent |
|---|---|
| $B_2O_3$ | 10–70 |
| $SiO_2$ | 15–60 |
| $Al_2O_3$ | 0–15 |
| one or more of $Na_2O$, $K_2O$ and $Li_2O$ | 5–60 |
| one or more of CaO, MgO, BaO, SrO, and BeO | 0–30. |

\* \* \* \* \*